United States Patent
Pendse (10) Patent No.: US 9,054,084 B2
(45) Date of Patent: Jun. 9, 2015

(54) INTEGRATED CIRCUIT HAVING STAGGERED BOND PADS AND I/O CELLS

(71) Applicant: Rajendra D Pendse, Fremont, CA (US)

(72) Inventor: Rajendra D Pendse, Fremont, CA (US)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/716,479

(22) Filed: Dec. 17, 2012

(65) Prior Publication Data

US 2013/0127061 A1 May 23, 2013

Related U.S. Application Data

(63) Continuation of application No. 11/279,741, filed on Apr. 13, 2006.

(60) Provisional application No. 60/594,705, filed on Apr. 29, 2005.

(51) Int. Cl.
| | |
|---|---|
| H01L 23/48 | (2006.01) |
| H01L 23/488 | (2006.01) |
| H01L 23/00 | (2006.01) |
| H01L 27/118 | (2006.01) |

(52) U.S. Cl.
CPC ............... *H01L 23/488* (2013.01); *H01L 24/06* (2013.01); *H01L 24/49* (2013.01); *H01L 27/11898* (2013.01); *H01L 24/03* (2013.01); H01L 2224/04042 (2013.01); H01L 2224/05599 (2013.01); H01L 2224/48247 (2013.01); H01L 2224/49171 (2013.01); H01L 2224/49431 (2013.01); H01L 2224/85399 (2013.01); H01L 2924/01082 (2013.01); H01L 2924/014 (2013.01); H01L 2924/14 (2013.01); H01L 2924/00014 (2013.01); H01L 2924/01033 (2013.01); H01L 2224/05554 (2013.01)

(58) Field of Classification Search
USPC .................. 438/106, 612; 257/691, 692, 693, 257/E23.06, E23.068, E23.07, E23.071
See application file for complete search history.

(56) References Cited

U.S. PATENT DOCUMENTS

| | | | |
|---|---|---|---|
| 4,947,233 A | 8/1990 | Aso | |
| 6,008,532 A | 12/1999 | Carichner | |
| 6,028,449 A | 2/2000 | Schmitt | |
| 6,720,636 B2 * | 4/2004 | Shimizu et al. | ............... 257/459 |
| 6,807,078 B2 | 10/2004 | Thies et al. | |
| 6,833,620 B1 | 12/2004 | Rosefield et al. | |
| 6,858,945 B2 | 2/2005 | Rakshani | |
| 6,953,997 B1 * | 10/2005 | Merigot et al. | ............... 257/773 |
| 7,071,561 B2 | 7/2006 | Chen | |
| 2004/0016980 A1 | 1/2004 | Nakadaira | |
| 2004/0188848 A1 * | 9/2004 | Nojiri et al. | ................... 257/773 |
| 2006/0131726 A1 * | 6/2006 | Bruch | ......................... 257/691 |

* cited by examiner

*Primary Examiner* — Robert Huber
(74) *Attorney, Agent, or Firm* — Ishimaru & Associates LLP (57) ABSTRACT

Staggered bond ads and I/O cells are arranged on an integrated circuit. The integrated circuit includes at least a first I/O cell having a first bond pad and first opposing set of recesses, a second I/O cell having a second bond sad and second opposing set of recesses, and a third I/O cell having a third bond sad and third opposing set of recesses. Each set of opposing recesses can be arranged in a staggered formation to receive adjacent bond pads, which can also be configured in a staggered formation.

12 Claims, 3 Drawing Sheets

INTEGRATED CIRCUIT HAVING STAGGERED BOND PADS AND I/O CELLS

CROSS-REFERENCE TO RELATED APPLICATIONS

This application is a continuation of co-pending U.S. patent application Ser. No. 11/279,741 filed Apr. 13, 2006, which claims the benefit of U.S. Provisional Patent Application Ser. No. 60/594,705 filed Apr. 29, 2005, each of which is herein incorporated by reference.

BACKGROUND

Modern electronics, such as smart phones, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

For those early types of integrated circuits, the interconnection to the integrated circuit package was relatively straightforward and generally involved leads arranged around a die cavity to be electrically connected to die pads. There were also relatively few circuits on each integrated circuit die and the circuit operational rates were, by modern day standards, relatively slow. Accordingly, the spacing and configuration of the leads with respect to the die pads did not pose additional difficulty for reliable assembly.

Virtually across all applications, there continues to be growing demand for reducing size of the integrated circuits. However, the size reduction often does not come with input/output (I/O) reduction for the integrated circuit to communicate to the external circuitry. As the integrated circuit technology advanced, more circuitry were able to be fabricated in a similar die area so that substantially increased functionality could be accomplished on a given integrated circuit die. The added functionality and increase in the number of circuitry involved generally required a larger number of discrete connections to the external world. As physical sizes decreased and the number of required die pads increased, it was necessary to develop integrated circuit dice and packages that would accommodate connections to a larger number of external connections. Both integrated circuit developers and integrated package manufacturers worked to develop die interconnect systems that would accommodate the higher die pad densities.

Numerous technologies have been developed to meet these requirements. Some of the research and development strategies focus on new technologies while others focus on improving the mature technologies. Research and development in the existing technologies may take a myriad of different directions. These approaches may involve improving integrated circuit technology, package technology, or a combination thereof.

The design process for integrated circuits usually consists of parallel design of the core circuitry and the I/O cell circuitry with a subsequent integration of the two. The I/O cell circuitry is usually developed in the form of "cell libraries" from which the desired cells for a given integrated circuit design are invoked, "dropped in" and wired to the core circuitry with suitable place and route tools.

The I/O cell circuitry, which consists of functional elements such as I/O drivers, electrostatic discharge (ESD) structures, and the bonding pads for external connection to a package, is usually contained within an "I/O cell". The appropriate I/O cells are then instantiated around the core of the chip by the chip design tools. The pitch of the I/O cells, and thus the pitch of the bonding pads, is an important parameter from the packaging standpoint.

For I/O intensive designs, the pitch is very fine (~50 um or less), making the packaging task more difficult. As such, so-called "staggered designs" have been developed, wherein I/O cells at alternating locations are offset relative to their nearest neighbors, resulting in a greater direct distance between adjacent bonding pads, thereby somewhat alleviating the task of packaging the chip.

Unfortunately, this approach also results in a die size penalty approximately equal to two times the amount of die pad offset per side. The die size penalty results in correspondingly fewer die per wafer and higher unit cost per die, which is understandably undesirable.

Thus, a need still remains for an integrated circuit package system having improved I/O cells providing reduced die size and providing higher I/O count without placing undesired burden on the packaging process. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

SUMMARY

The present disclosure, in one embodiment, provides an integrated circuit package system having a first I/O cell having a first recess, a first bond pad adjacent the first recess, where the width of the first bond pad being greater than the width of the first I/O cell, a second I/O cell adjacent the first I/O cell, the second I/O cell having a second recess and a second bond pad adjacent the second recess, where the width of the second bond pad being greater than the width of the second I/O cell.

In this embodiment, the first recess is configured to receive the second bond pad and the second recess is configured to receive the first bond pad. The resulting package system is able to provide two bond pads having a horizontal overlap of at least about 5%.

In one embodiment, the first I/O cell and the second I/O cell have the same width. In another embodiment, the first bond pad and the second bond pad have the same width.

In one embodiment, the package system further includes a first external interconnect connected to the first I/O cell and a second external interconnect connected to the second I/O cell.

In one embodiment, the resulting package system is able to provide two bond pads having a horizontal overlap of at least about 10%. In another embodiment, the resulting package system is able to provide two bond pads having a horizontal overlap of at least about 25%.

The present disclosure, in one embodiment, provides an integrated circuit package system having a first I/O cell having a first bond pad, the width of the first bond pad being greater than the width of the first I/O cell, and a second I/O having a second bond pad, the width of the second bond pad being greater than the width of the second I/O cell. In this embodiment, the two bond pads have a staggered configuration resulting in a horizontal overlap of at least about 5%.

In one embodiment, the first I/O cell further includes a first recess and the second I/O cell further includes a second recess, where the first recess is configured to receive the second bond pad and the second recess is configured to receive the first bond pad.

In another embodiment, the first I/O cell and the second I/O cell have the same width. In yet another embodiment, the first bond pad and the second bond pad have the same width.

In one embodiment, the resulting package system is able to provide two bond pads having a horizontal overlap of at least about 10%. In another embodiment, the resulting package system is able to provide two bond pads having a horizontal overlap of at least about 25%.

The present disclosure provides, in one embodiment, a method of manufacturing an integrated circuit package system by forming a first I/O cell having a first recess and a first bond pad adjacent the first recess, the width of the first bond pad being greater than the width of the first I/O cell, and forming a second I/O cell adjacent the first I/O cell, the second I/O cell having a second recess and a second bond pad adjacent the second recess, the width of the second bond pad being greater than the width of the second I/O cell.

In this embodiment, the method includes configuring the first recess to receive the second bond pad and configuring the second recess to receive the first bond pad. The method further includes providing the two bond pads to produce a horizontal overlap of at least about 5%.

In one embodiment, the method of manufacturing the integrated circuit package system includes forming the first I/O cell and forming the second I/O cell results in the two I/O cells having the same width. In another embodiment, the method of manufacturing the integrated circuit package system includes forming the first I/O cell having the first bond pad and forming the second I/O cell having the second bond pad results in the two bond pads having the same width.

In one embodiment, the method of manufacturing the integrated circuit package system further includes connecting a first external interconnect to the first I/O cell and connecting a second external interconnect to the second I/O cell.

In some embodiments, the method of manufacturing the integrated circuit package system includes providing the two bond pads to result in a horizontal overlap of at least about 10%, or providing the two bond pads to result in a horizontal overlap of at least about 25%.

Other variations, embodiments and features of the present disclosure will become evident from the following detailed description, drawings and claims.

DETAILED DESCRIPTION OF THE DISCLOSURE

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

In the following description, numerous specific details are given to provide a thorough understanding of the disclosure. However, it will be apparent that the disclosure may be practiced without these specific details. In order to avoid obscuring the present disclosure, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material, patterning, exposure, development, etching, cleaning, molding, and/or removal of the material or as required in forming a described structure.

Figure 1:
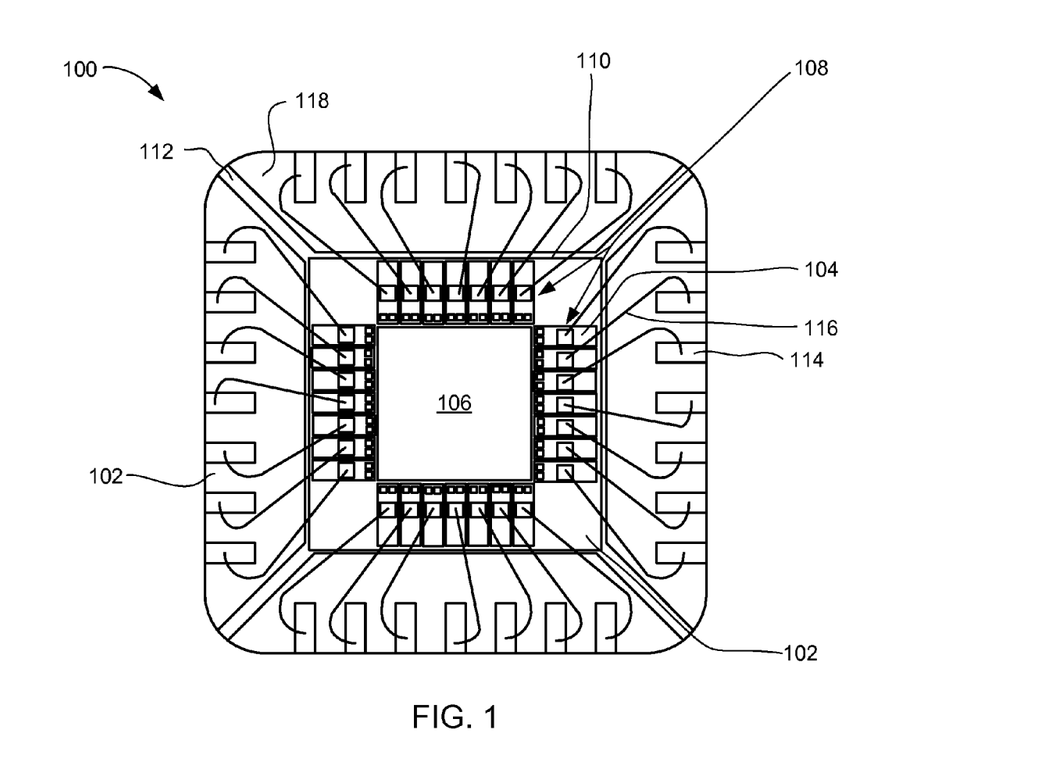
FIG. 1 is a plan view of an integrated circuit package system in an embodiment of the present disclosure.

Referring now to FIG. 1, therein is shown a plan view of an integrated circuit package system 100 in an embodiment of the present disclosure. An integrated circuit die 102 includes I/O cells 104 bridging the communication between the external world and a core 106 at the interior of the integrated circuit die 102. The I/O cells 104 are instantiated adjacent to one another along the boundary of the integrated circuit die 102 forming an I/O ring 108. The core 106 includes circuitry, such as digital, analog, memory, or power circuitry, and located within the I/O ring 108.

The integrated circuit die 102 mounts on a die paddle 110, wherein the die paddle 110 attaches to tie bars 112. The I/O cells 104 connect to external interconnects 114, such as leads or lead finders, with interconnects 116, such as bond wires. An encapsulation 118, such as an epoxy mold compound (EMC), covers the integrated circuit die 102, the interconnects 116, the die paddle 110, and the tie bars 112. The encapsulation 118 also exposes a portion of the external interconnects 114 for further connections to the next system level (not shown), such as a printed circuit board or another integrated circuit package.

For illustrative purpose, the integrated circuit package system 100 has the die paddle 110, although it is understood that the die paddle 110 may not be included. Also of illustrative purpose, the tie bars 112 attach to the die paddle 110, although it is understood that the tie bars 112 may not be included. Further for illustrative purpose, the integrated circuit die 102 is shown as having a single row of the external interconnects 114, although it is understood that the number of rows may be differ. Yet further for illustrative purpose, the interconnects 116 are shown as bond wires, although it is understood that other types of interconnects may be used, such as solder bumps. Yet further for illustrative purpose, the interconnects 116 are shown connecting the I/O cells 104 and the external interconnects 114, although it is understood that the interconnects 116 may form other connections, such as between the I/O cells 104 and the core 106, or the external interconnects 114 and the core 106.

As integrated circuit technology continues to shrink, more functions may be packed in the core 106 or the same equivalent function requires less area of the core 106. The integrated circuit technology progression is not always accompanied by a count reduction of the external interconnects 114 for the integrated circuit die 102. As the core 106 continues to shrink or the number of the external interconnects 114 remain the same or increase, the integrated circuit die 102 reaches a condition referred to as I/O limited. This condition exists when the physical dimensions of the I/O cells 104 and the I/O ring 108 limits the minimum die size of the integrated circuit die 102 regardless on the amount of functions in the core 106.

Further, connections to the external world do not permit the I/O cells 104 to scale in size as the circuitry in the core 106. Both functional requirements, such as voltage levels or drive current, and reliability requirements, such as electrostatic discharge (ESD), latch up, or undershoot/overshoot immunity, prohibit circuitry size reduction in the I/O cells 104 further increasing the likelihood of reaching an I/O limited condition.

Modern electronics are exposed to wider and more aggressive environmental as well operational ranges. This places more emphasis for the integrated circuit die 102 to tolerate a wider range of system environments forcing more circuitry functions to be designed in the I/O cells 104. This also exacerbates the likelihood of forming the integrated circuit die 102 that is I/O limited.

Figure 2:
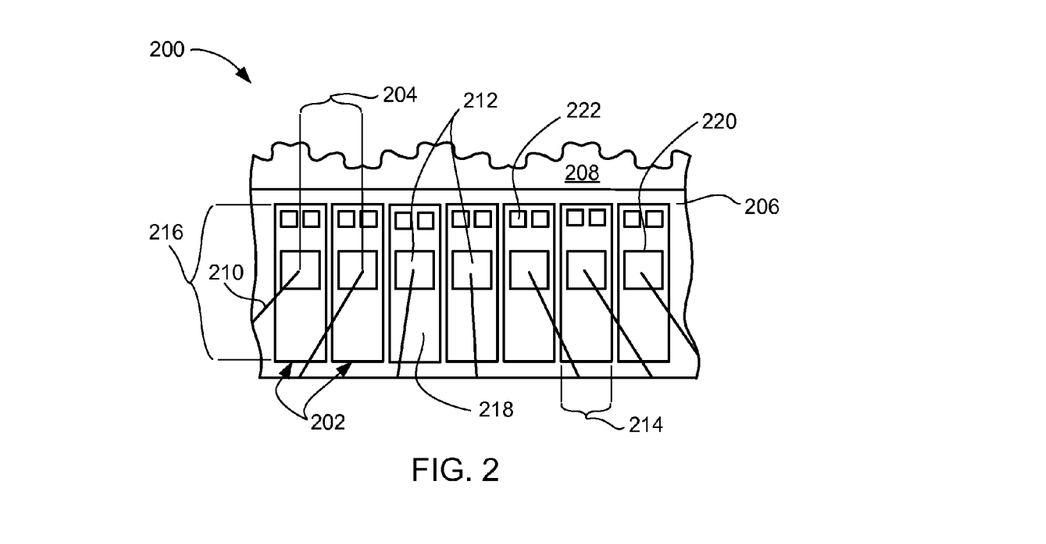
FIG. 2 is a more detailed view of a first I/O ring with a first I/O cell in an embodiment of the present disclosure.

Referring now to FIG. 2, therein is shown a more detailed view of a first I/O ring 200 with a first I/O cell 202 in an embodiment of the present disclosure. The first I/O ring 200 may represent the I/O ring 108 of FIG. 1. The first I/O cell 202 may represent one of the I/O cells 104 of FIG. 1.

The first I/O ring 200 depicts the first I/O cell 202 repetitively instantiated next to one another separated by a pitch 204 along a side of an integrated circuit die 206. The first I/O ring 200 is between an edge of the integrated circuit die 206 and a core 208. An interconnect 210, such as a bond wire, connects a bond pad 212 of the first I/O cell 202 and one of the external interconnects 114 shown in FIG. 1. For illustrative purpose, the bond pad 212 is shown in a square geometric shape, although it is understood that the bond pad 212 may be formed in different geometric shapes, such as a circle or a polygon.

Shrinking integrated circuit technology push the size of the integrated circuit die 206 and the first I/O ring 200 smaller. Decreasing the first I/O ring 200 for the integrated circuit die 206 that is I/O limited requires a decrease of a cell width 214 of the first I/O cell 202 and the pitch 204. To accommodate the I/O circuitry, a cell length 216 of the first I/O cell 202 increases. Packaging processes impose restrictions on the size of the bond pad 212 for reliable and high yield wire bonding providing a lower bound of the cell width 214, wherein the cell width 214 is about equal to a width of the bond pad 212.

A circuitry area 218 of the first I/O cell 202 provides the area for the I/O circuitry. The circuitry area 218 traverses the cell length 216 and surrounds the bond pad 212 along opposing perimeter segments 220, sides, of the bond pad 212. Contacts 222 are at a core side of the first I/O cell 202 for connections to the core 208.

Figure 3:
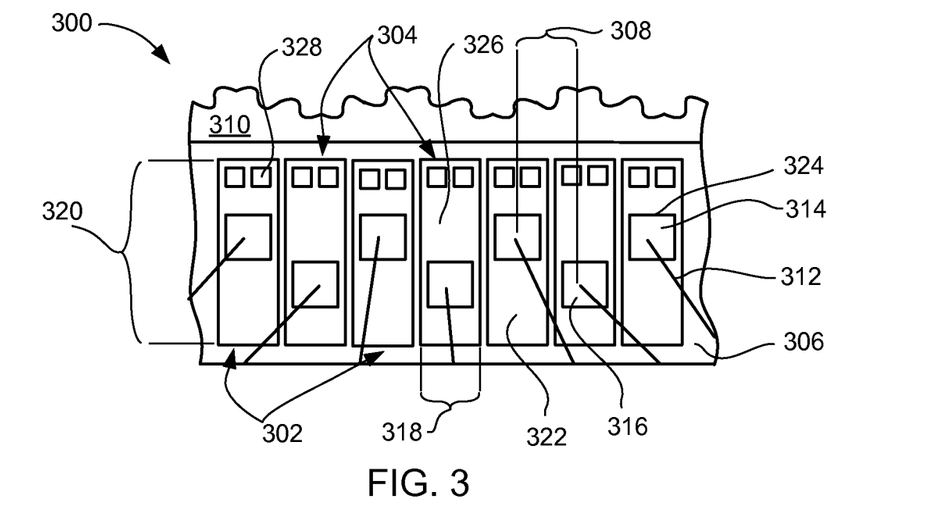
FIG. 3 is a more detailed view of a second I/O ring with a first I/O cell and a second I/O cell in an alternative embodiment of the present disclosure.

Referring now to FIG. 3, therein is shown a more detailed view of a second I/O ring 300 with a first I/O cell 302 and a second I/O cell 304 in an alternative embodiment of the present disclosure. The second I/O ring 300 may represent the I/O ring 108 of FIG. 1. The first I/O cell 302 and the second I/O cell 304 may represent the I/O cells 104 of FIG. 1 adjacent to each other.

The second I/O ring 300 depicts the first I/O cell 302 and the second I/O cell 304 alternately instantiated next to one another along a side of an integrated circuit die 306, separated by a pitch 308, and having a same cell length. The second I/O ring 300 is between an edge of the integrated circuit die 306 and a core 310. Interconnects 312, such as bond wires, connect between a first bond pad 314 of the first I/O cell 302 and a second bond pad 316 of and exposed from the second I/O cell 304 to the external interconnects 114 shown in FIG. 1. For illustrative purpose, the first bond pad 314 and the second bond pad 316 are shown in a square geometric shape, although it is understood that the first bond pad 314 and the second bond pad 316 may be formed in different geometric shapes, such as a circle or a polygon.

Shrinking integrated circuit technology push the size of the integrated circuit die 306 and the second I/O ring 300 smaller. Decreasing the second I/O ring 300 for the integrated circuit die 306 that is I/O limited requires a decrease of a cell width 318 of the first I/O cell 302 and the second I/O cell 304 as well as the pitch 308. To accommodate the I/O circuitry, a cell length 320 of the first I/O cell 302 and the second I/O cell 304 increases. Packaging processes impose restrictions on the size of the first bond pad 314 and the second bond pad 316 for reliable and high yield wire bonding providing a lower bound of the cell width 318, wherein the cell width 318 is about equal to a width of the first bond pad 314 or the second bond pad 316. To further increase yield and minimize wire crossings, the first bond pad 314 and the second bond pad 316 are staggered lengthwise such that the first bond pad 314 and the second bond pad 316 do not laterally overlap. The staggered nonoverlapped positions of the first bond pad 314 and the second bond pad 316, relative to one another, may be adjusted such that the direct distance between the first bond pad 314 and the second bond pad 316 may be increased.

A first circuitry area 322 of the first I/O cell 302 provides the area for the I/O circuitry. The first circuitry area 322 traverses the cell length 320 of the first I/O cell 302 and surrounds the first bond pad 314 along opposing perimeter segments 324, sides, of the first bond pad 314. A second circuitry area 326 of the second I/O cell 304 provides the area for the I/O circuitry. The second circuitry area 326 traverses the cell length 320 of the second I/O cell 304 and surrounds the second bond pad 316 along the perimeter segments 324 on opposite sides of the second bond pad 316. Contacts 328 are at a core side of the first I/O cell 302 and the second I/O cell 304 for connections to the core 310.

Figure 4:
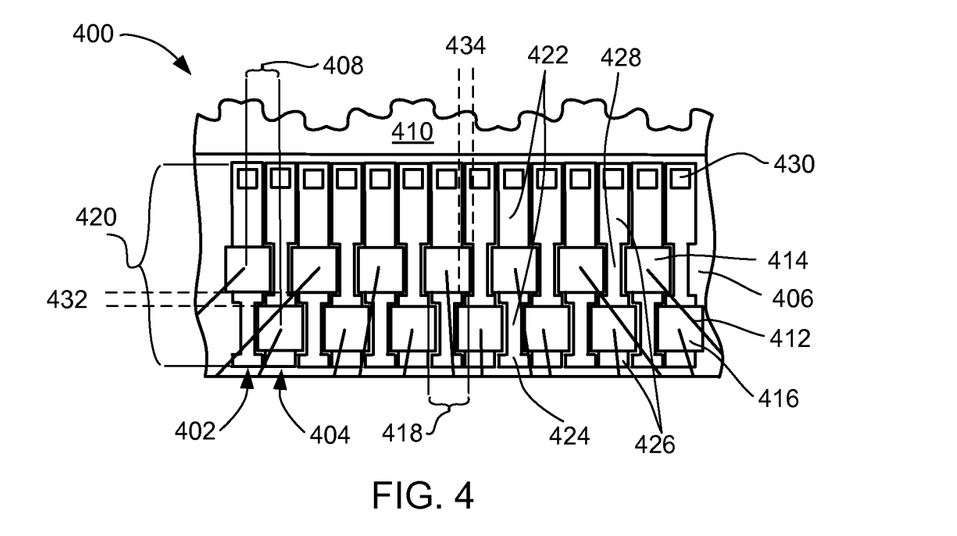
FIG. 4 is a more detailed view of a third I/O ring with a first I/O cell and a second I/O cell in another alternative embodiment of the present disclosure.

Referring now to FIG. 4, therein is shown a more detailed view of a third I/O ring 400 with a first I/O cell 402 and a second I/O cell 404 in another alternative embodiment of the present disclosure. The third I/O ring 400 may represent the I/O ring 108 of FIG. 1. The first I/O cell 402 and the second I/O cell 404 may represent the I/O cells 104 of FIG. 1 adjacent to each other.

The third I/O ring 400 depicts the first I/O cell 402 and the second I/O cell 404 alternately instantiated next to one another along a side of an integrated circuit die 406 and separated by a pitch 408. The third I/O ring 400 is between an edge of the integrated circuit die 406 and a core 410. Interconnects 412, such as bond wires, connect a first bond pad 414 of the first I/O cell 402 and a second bond pad 416 of the second I/O cell 404 to the external interconnects 114 shown in FIG. 1. For illustrative purpose, the first bond pad 414 and the second bond pad 416 are shown in a square geometric shape, although it is understood that the first bond pad 414 and the second bond pad 416 may be formed in different geometric shapes, such as a circle or a polygon.

Shrinking integrated circuit technology push the size of the integrated circuit die 406 and the third I/O ring 400 smaller. Decreasing the third I/O ring 400 for the integrated circuit die 406 that is I/O limited requires a decrease of a cell width 418 of the first I/O cell 402 and the second I/O cell 404 as well as the pitch 408. To accommodate the I/O circuitry, a cell length 420 of the first I/O cell 402 and the second I/O cell 404 increases. Packaging processes impose restrictions on the size of the first bond pad 414 and the second bond pad 416 for reliable and high yield wire bonding providing a lower bound of the cell width 418, wherein the cell width 418 is a width of the first bond pad 414 or the second bond pad 416. To further increase yield and minimize wire crossings, the first bond pad 414 and the second bond pad 416 are staggered lengthwise such that the first bond pad 414 and the second bond pad 416 do not vertically overlap 432 but do exhibit horizontal overlap 434. In this instance there can be no vertical overlap 432 between the first bond pad 414 and the second bond pad 416 because doing so would result in shorting of the adjacent I/O cells 402, 404. The horizontal overlap 434 is due to the recessed shaped configuration of the I/O cells 402, 404 as well as the staggered configuration of the bond pads 414, 416. This will be discussed in more detail below.

Figure 5:
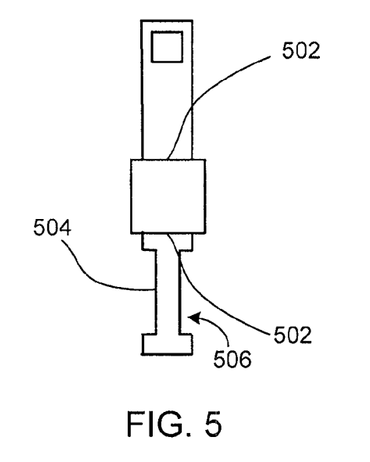
FIG. 5 is a more detailed view of the first I/O cell of FIG. 4.

The first I/O cell 402 has a first circuitry area 422 for the I/O circuitry, wherein the first circuitry area 422 has a first tapered area 424. The first circuitry area 422 traverses the cell length 420 with the first tapered area 424 along a side of the first bond pad 414 towards the edge of the integrated circuit die 406. The first recess 504 of FIG. 5 is at the first tapered area 424 of the first circuitry area 422. The first circuitry area 422 extends from the first bond pad 414 toward the core 410. The first circuitry area 422 extends from the first bond pad 414 toward the first recess 504. The first circuitry area 422 extends beyond the first recess 504 to the end of the first I/O cell 402.

Figure 6:
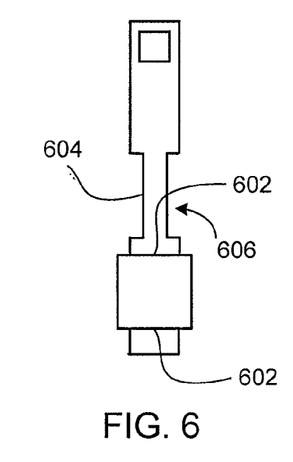
FIG. 6 is a more detailed view of the second I/O cell of FIG. 4.

The second I/O cell 404 has a second circuitry area 426 for the I/O circuitry, wherein the second circuitry area 426 has a second tapered area 428. The second circuitry area 426 traverses the cell length 420 with the second tapered area 428 on the core side of the second bond pad 416. The second recess 604 of FIG. 6 is at the second tapered area 428 of the second circuitry area 426. The second circuitry area 426 extends from the second bond pad 416 toward the second recess 604 and the core 410. The second circuitry area 426 extends to the end of the first I/O cell 402 on the side facing away from the core 410.

The location of the first tapered area 424 provides space for a portion of the second bond pad 416. The location of the second tapered area 428 provides space for a portion the first bond pad 414. The complementary tapered sections and adjacent bond pads allow for a higher I/O density in the third I/O ring 400. Contacts 430 are at the core side of the first I/O cell 402 and the second I/O cell 404 for connections to the core 410. The first bond pad 414 is between the contracts 430 and the first recess 504. The second recess 604 is between the second bond pad 416 and the contracts 430. The contacts 430 are at the edge of the first I/O cell 402 and the second I/O cell 404. The contacts 430 can be aligned with one another and set off from the edges of the first I/O cell 402 and the second I/O cell 404.

Referring now to FIG. 5, therein is shown a more detailed view of the first I/O cell 402 of FIG. 4. The first bond pad 414 is wider than the first circuitry area 422. The first recess 504 and the first matching, recess 506 are formed in the first circuitry area 422. The first circuitry area 422 extending outward on both sides of the first bond pad 414. The first tapered area 424 is on a perimeter segment 502, a side, of the first bond pad 414 nearest the edge side of the integrated circuit die 406. A first recess 504 of the first tapered area 424 provides a space for a portion of the second bond pad 416 shown in FIG. 4 for the second I/O cell 404 shown in FIG. 4 adjacent to the first I/O cell 402. A first matching recess 506 can be opposite the first recess 504.

The first bond pad 414 may be formed with the integrated circuit technology used to fabricate the integrated circuit die 406 of FIG. 4. The first bond pad 414 may be optionally formed with the post-passivation processing of the integrated circuit die 406 providing the surface area needed for reliable wire bonding while further reducing a width of the first circuitry area 422.

Referring now to FIG. 6, therein is shown a more detailed view of the second I/O cell 404 of FIG. 4. The second bond pad 416 is wider than the second circuitry area 426. The second tapered area 428 is on a perimeter segment 602, a side, of the second bond pad 416 nearest the core side of the integrated circuit die 406. A second recess 604 of the second tapered area 428 provides a space for a portion of the first bond pad 414 shown in FIG. 4 for the first I/O cell 402 shown in FIG. 4 adjacent to the second I/O cell 404. A second matching recess 606 can be opposite the second recess 604.

The second circuitry area 426 on the edge side of the second bond pad 416 may optionally not have circuitry or the second bond pad 416 may be optionally formed at the edge side of the second I/O cell 404. The second bond pad 416 may be optionally formed with the post-passivation processing of the integrated circuit die 406 providing the surface area needed for reliable wire bonding while further reducing a width of the second circuitry area 426.

In one embodiment, an integrated circuit package system 400 includes a first I/O cell 402 having a first recess 504 and a first bond pad 414 adjacent the first recess 504, where the width of the first bond pad 502 is greater than the width of the first I/O cell 402. The system further includes a second I/O cell 404 adjacent the first I/O cell 402, the second I/O cell 404 having a second recess 604 and a second bond pad 416 adjacent the second recess 604, where the width of the second bond pad 416 is greater than the width of the second I/O cell 404. The two I/O cells 402, 404 are configured to be adjacent to one another as shown in FIG. 4, where the I/O cells 402, 404 include the characteristics shown in FIGS. 5 and 6.

In this example, the first recess 504 is configured to receive the second bond pad 416 while the second recess 604 is configured to receive the first bond pad 414. It will be appreciated by one skilled in the art that this can be achieved by bringing together FIGS. 5 and 6 to produce the alternating I/O cells shown in FIG. 4. The first recess 504 is larger than the second bond pad 416 and sized to accommodate and receive the second bond pad 416. A portion of the second bond pad 416 including two directly adjacent sequential corners is within the perimeter of the first recess 504. The second recess 604 is larger than the first bond pad 414 and sized to accommodate and receive the first bond pad 414. A portion of the first bond pad 414 including two directly adjacent sequential corners is within the perimeter of the second recess 604. The I/O ring 400 of FIG. 4 can include a plurality of the first recess 504, the second recess 604, the first bond pad 414, and the second bond pad 416.

In one embodiment, the resulting configuration can produce an integrated circuit package system 400 where two adjacent bond pads 414, 416 can have a horizontal overlap 434 of at least about 5%. In another embodiment, the resulting horizontal overlap 434 can be at least about 10%. In yet another embodiment, the resulting horizontal overlap 434 can be at least about 25%. It will be further appreciated by one skilled in the art that the horizontal overlap 434 can be achieved as a result of the staggered configuration of not only the bond pads 414, 416 but also because of the staggered configuration and the recessed shapes of adjacent I/O cells 402, 404. The horizontal overlap 434 can be defined as the amount of overlap between adjacent bond pads 414, 416 where conventional staggered configuration, although resulting in ease of bonding external interconnects to the bond pads 414, 416, do not achieve any space or die size savings. In contrast, the current embodiment is able to achieve substantial horizontal overlap 434 between the bond pads 414, 416 so as to result in shrinkage of the I/O cells 402, 404 and overall die size and dimension.

In these embodiments, the bond pads 414, 416 are able to maintain the same width (e.g., size) without compromising performance. Furthermore, not only are the size of the bond pads 414, 416 not compromised, adjacent I/O cells 402, 404 are able to maintain the same width resulting in an overall cell size that is smaller than one without the staggered/tapered/recessed combination. In other words, the pitch 408 in FIG. 4 is smaller than the pitch 308 in FIG. 3. Although both configurations have staggered bond pads 414, 416, the configuration in FIG. 4 has a smaller pitch 408 because of the tapering, staggered, and recessed shapes of the I/O cells 402, 404 for accommodating adjacent I/O cells. The improvement in FIG. 4 is that of reduced cell width and die size yet maintaining performance and bondability to the package system 400 because the size of the bond pads 414, 416 are not compromised or reduced.

In some embodiments, it will be understood by one skilled in the art that external interconnects 412 can be coupled or connected to the I/O cells 402, 404 to further facilitate manufacturing of the package system 400. Specifically, a first external interconnect 412 can be connected to the first bond pad 414 of the first I/O cell 402 while a second external interconnect 412 can be connected to the second bond pad 416 of the second I/O cell 404. These external interconnects 412 can be bonded to the bond pads 414, 416 similar to conventional bond pads 414, 416 without added difficulties because the size of the bond pads 414, 416 remain unchanged.

In one embodiment, an integrated circuit package system 400 includes a first I/O cell 402 having a first bond pad 414 where the width of the first bond pad 414 is greater than the width of the first I/O cell 402. The system 400 further includes a second I/O cell 404 having a second bond pad 416 where the width of the second bond pad 416 is greater than the width of the second I/O cell 404. The two bond pads 414, 416 can have a staggered configuration resulting in a horizontal overlap 434 of at least about 5%.

In some embodiments, the two bond pads 414, 416 can have a staggered configuration resulting in a horizontal overlap 434 of at least about 10%, or at least about 15%, or at least about 20%, or at least about 25%, or at least about 30%, or at least about 40%, or at least about 50%.

In other embodiments, the first I/O cell 402 further includes a first recess 504 and the second I/O cell 404 further includes a second recess 604, where the first recess 504 is configured to receive the second bond pad 416 and the second recess 604 is configured to receive the first bond pad 414.

Similar to the embodiments described above, in these embodiments, the first I/O cell 402 and the second I/O cell 404 are able to maintain the same width, while the width of the first bond pad 414 and the second bond pad 416 can be similarly maintained. The resulting package system 400 is able to maintain performance by not comprising on the size of the bond pads 414, 416 yet is able to reduce overall cell size of the I/O cells 402, 404 and resulting die size.

In one embodiment, a method of manufacturing an integrated circuit package system 400 includes forming a first I/O cell 402 having a first recess 504 and a first bond pad 414 adjacent the first recess 504, the width of the first bond pad 414 being greater than the width of the first I/O cell 402. The method further includes forming a second I/O cell 404 adjacent the first I/O cell 402, the second I/O cell 404 having a second recess 604 and a second bond pad 416 adjacent the second recess 604, the width of the second bond pad 416 being greater than the width of the second I/O cell 404.

In this embodiment, the method includes configuring the first recess 504 to receive the second bond pad 416 and configuring the second recess 604 to receive the first bond pad 414. The resulting method provides the two bond pads to produce a horizontal overlap of at least about 5%.

In one embodiment, the method of forming the first I/O cell 402 and forming the second I/O cell 404 results in the two I/O cells 402, 404 having the same width. In another embodiment, the method of forming the first I/O cell 402 having the first bond pad 414 and forming the second I/O cell 404 having the second bond pad 416 results in the two bond pads 414, 416 having the same width.

The method includes, in another embodiment, connecting a first external interconnect 412 to the first I/O cell 402 and connecting a second external interconnect 412 to the second I/O cell 404. The external interconnects 412 are necessary to facilitate the formation of the overall package system 400 with reduced pitch and footprint similar to that discussed above without compromising size of bond pads 414, 416 and performance.

In some embodiments, the method of manufacturing the integrated circuit package system results in providing the two bond pads to result in a horizontal overlap of at least about 10%, or at least about 15%, or at least about 20%, or at least about 25%.

Figure 7:
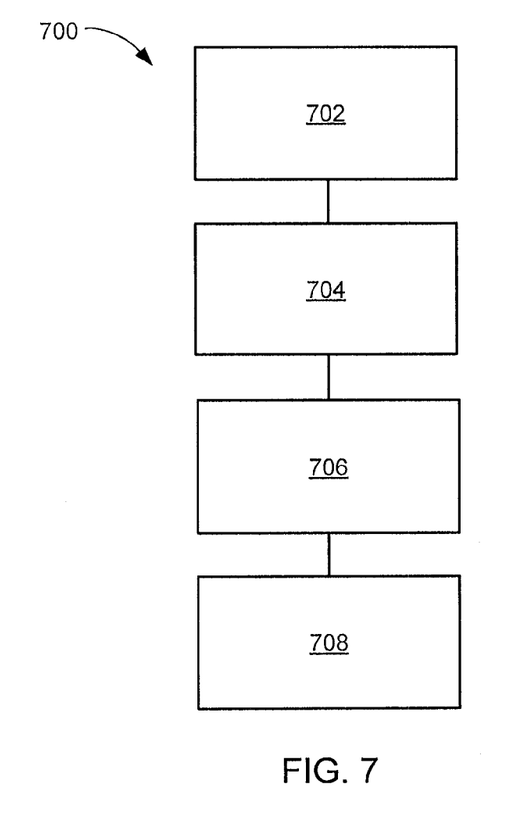
FIG. 7 is a flow chart of an integrated circuit package system for manufacture of the integrated circuit package system in an embodiment of the present disclosure.

Referring now to FIG. 7, therein is shown a flow chart of an integrated circuit package system 700 for manufacture of the integrated circuit package system 100 in an embodiment of the present disclosure. The system 700 includes forming a first I/O cell having a first circuitry area and a first bond pad with the first circuitry area partitioned along a cell length and on opposing perimeter segments of the first bond pad in a block 702; forming an I/O ring having the first I/O cell in a block 704; forming an integrated circuit die having the I/O ring in a block 706; and connecting an external interconnect and the first bond pad in a block 708.

It has been discovered that the present disclosure thus has numerous aspects.

It has been discovered that the present disclosure addresses the problem of the die size penalty for I/O limited integrated circuits through circuit partition in the I/O cell relative to the bond pad.

An aspect of the present disclosure is that the circuit partition to both opposing sides of the I/O cell bond pad allows additional degree of freedom for wire bonding with a decrease the width and increase the length of the I/O cell. This additional flexibility lowers the I/O limited threshold allowing smaller die size and reducing overall cost of the integrated circuit. Smaller die size improves wafer yield to further reduce the cost of the integrated circuits.

Another aspect of the present disclosure improves integrated circuit package system with I/O limited integrated circuits with staggered bond pad placement of adjacent I/O cells and the circuitry partition on both sides of the bond pad. The staggered location also minimizes wire crossing.

Yet another aspect of the present disclosure addresses the problem of the die size penalty while retaining the advantage of the staggered design, i.e. increased spacing of adjacent bond pads. It further offers the possibility of making the bond pad size bigger relative to the circuit area, which results in additional simplification of the package structure and process.

Yet another aspect of the present disclosure is the flexibility to create the bond pad for the wire bonding with the semiconductor process used to fabricate the integrated circuit or a post passivation process. This allows additional flexibility to reduce the I/O cell dimension to lower the I/O limiting condition threshold providing higher yield and lower cost.

Thus, it has been discovered that the integrated circuit package system method of the present disclosure furnishes important and heretofore unknown and unavailable solutions, capabilities, and functional aspects for reducing integrated circuit dimensions and lowering cost in systems. The resulting processes and configurations are straightforward, cost-effective, uncomplicated, highly versatile and effective, can be implemented by adapting known technologies, and are thus readily suited for efficiently and economically manufacturing stacked integrated circuit package in packaged devices.

While the disclosure has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

Although the current description has been described in detail with reference to several embodiments, additional variations and modifications exist within the scope and spirit of the disclosure.

What is claimed is:

1. An integrated circuit comprising:
    a first I/O cell having:
        a first recess and a first matching recess opposite the first recess, the first recess at a first tapered area on a first circuitry area, the first recess and the first matching recess formed in the first circuitry area, the first matching recess at a second tapered area on the first circuitry area;
        a first bond pad adjacent the first recess and the first matching recess, the first circuitry area extending outward with equal width on both sides of the first bond pad, the width of the first bond pad being greater than the width of the first I/O cell, and the first bond pad between the first recess and a first contact at the edge of the core side of the first I/O cell;
    a second I/O cell on a first side of the first I/O cell, the second I/O cell having:
        a second recess and a second matching recess opposite the second recess, the second recess at a third tapered area on a second circuitry area, the second recess and the second matching recess formed in the second circuitry area, the second matching recess at a fourth tapered area on the second circuitry area;
        a second bond pad adjacent the second recess and the second matching recess, the second circuitry area extending outward with equal width on both sides of the second bond pad, the width of the second bond pad being greater than the width of the second I/O cell, and the second recess between the second bond pad and a second contact at the edge of the core side of the second I/O cell;
    a third I/O cell on a second side of the first I/O cell, the second side opposite the first side, the third I/O cell having:
        a third recess and a third matching recess opposite the third recess, the third recess at a fifth tapered area on a third circuitry area, the third recess and the third matching recess in the third circuitry area, the third matching recess at a sixth tapered area on the third circuitry area;
        a third bond pad adjacent the third recess and the third matching recess, the third circuitry area extending outward with equal width on both sides of the third bond pad, the width of the third bond pad being greater than the width of the third I/O cell, and the third bond pad between the third recess and a third contact on the core side of the third I/O cell;
    wherein the first recess is sized to receive a portion of the second bond pad including two directly adjacent sequential corners of the second bond pad;
    wherein the first matching recess is sized to receive a portion of the third bond pad including two directly adjacent sequential corners of the third bond pad;
    wherein the second matching recess and the third matching recess are sized together to receive the first bond pad;
    wherein the first bond pad and the second bond pad have a first horizontal overlap of at least about 5%; and
    wherein the first bond pad and the third bond pad have a second horizontal overlap of at least about 5%.

2. The integrated circuit of claim 1, wherein the first I/O cell, the second I/O cell, and the third I/O cell each has the same width.

3. The integrated circuit of claim 1, wherein the first bond pad, the second bond pad, and the third bond pad each has the same width.

4. The integrated circuit of claim 1, further comprising:
    a first external interconnect connected to the first I/O cell,
    a second external interconnect connected to the second I/O cell, and
    a third external interconnect connected to the third I/O cell.

5. The system of claim 1, further comprising:
    a fourth I/O cell adjacent the second I/O cell on the side opposite the first I/O cell, the fourth I/O cell having:
        a fourth recess;
        a fourth bond pad adjacent the fourth recess, the width of the fourth bond pad being greater than the width of the fourth I/O cell;
    wherein the fourth recess is configured to receive the second bond pad; and
    wherein the fourth bond pad is capable of being received by the second recess.

6. The system of claim 1, further comprising:
    a fifth I/O cell adjacent the third I/O cell on the side opposite the first I/O cell, the fifth I/O cell having:
        a fourth matching recess;
        a fifth bond pad adjacent the fourth matching recess, the width of the fifth bond pad being greater than the width of the fifth I/O cell;

wherein the fourth matching recess is configured to receive the third bond pad; and wherein the fifth bond pad is capable of being received by the third recess.

7. A method of manufacturing an integrated circuit comprising:

forming a first I/O cell having:
   a first recess and a first matching recess opposite the first recess, the first recess at a first tapered area on a first circuitry area, the first recess and the first matching recess formed in the first circuitry area, the first matching recess at a second tapered area on the first circuitry area;
   a first bond pad adjacent the first recess and the first matching recess, the first circuitry area extending outward with equal width on both sides of the first bond pad, the width of the first bond pad being greater than the width of the first I/O cell, and the first bond pad between the first recess and a first contact at the edge of the core side of the first I/O cell;

forming a second I/O cell on a first side of the first I/O cell, the second I/O cell having:
   a second recess and a second matching recess opposite the second recess, the second recess at a third tapered area on a second circuitry area, the second recess and the second matching recess formed in the second circuitry area, the second matching recess at a fourth tapered area on the second circuitry area;
   a second bond pad adjacent the second recess and the second matching recess, the second circuitry area extending outward with equal width on both sides of second bond pad, the width of the second bond pad being greater than the width of the second I/O cell, and the second recess between the second bond pad and a second contact at the edge of the core side of the second I/O cell;

forming a third I/O cell on a second side of the first I/O cell, the second side opposite the first side, the third I/O cell having:
   a third recess and a third matching recess opposite the third recess, the third recess at a fifth tapered area on a third circuitry area, the third recess and the third matching recess formed in the third circuitry area, the third matching recess at a sixth tapered area on the third circuitry area;
   a third bond pad adjacent the third recess and the third matching recess, the third circuitry area extending outward with equal width on both sides of the third bond pad, the width of the third bond pad being greater than the width of the third I/O cell, and the third bond pad between the third recess and a third contact on the core side of the first I/O cell;

sizing the first recess to receive a portion of the second bond pad including two directly adjacent sequential corners of the second bond pad;

sizing the first matching recess to receive a portion of the third bond pad including two directly adjacent sequential corners of the third bond pad;

sizing the second matching recess and the third matching recess together to receive the first bond pad;

configuring the first bond pad and the second bond pad to produce a first horizontal overlap of at least about 5%; and configuring the first bond pad and the third bond pad to produce a second horizontal overlap of at least about 5%.

8. The method of claim 7, wherein forming the first I/O cell, forming the second I/O cell, and forming the third I/O cell results in each of the I/O cells having the same width.

9. The method of claim 7, wherein forming the first I/O cell having the first bond pad, forming the second I/O cell having the second bond pad, and forming the third I/O cell having the third bond pad results in each of the bond pads having the same width.

10. The method of claim 7, further comprising:
connecting a first external interconnect to the first I/O cell,
connecting a second external interconnect to the second I/O cell, and
connecting a third external interconnect to the third I/O cell.

11. The method of claim 7, further comprising:
forming a fourth I/O cell adjacent the second I/O cell on the side opposite the first I/O cell, the fourth I/O cell having:
   a fourth recess;
   a fourth bond pad adjacent the fourth recess, the width of the fourth bond pad being greater than the width of the fourth I/O cell;
configuring the fourth recess to receive the second bond pad; and
configuring the fourth bond pad so as to allow the fourth bond pad to be received by the second recess.

12. The method of claim 7, further comprising:
forming a fifth I/O cell adjacent the third I/O cell on the side opposite the first I/O cell, the fifth I/O cell having:
   a fourth matching recess;
   a fifth bond pad adjacent the fourth matching recess, the width of the fifth bond pad being greater than the width of the fifth I/O cell;
configuring the fourth matching recess to receive the third bond pad; and
configuring the fifth bond pad so as to allow the fifth bond pad to be received by the third recess.

* * * * *